(12) United States Patent
Mondal et al.

(10) Patent No.: US 10,879,686 B2
(45) Date of Patent: Dec. 29, 2020

(54) OVERCURRENT PROTECTION FOR UNIVERSAL SERIAL BUS TYPE-C (USB-C) CONNECTOR SYSTEMS

(71) Applicant: Cypress Semiconductor Corporation, San Jose, CA (US)

(72) Inventors: Partha Mondal, Paschim Medinipur (IN); Hemant P. Vispute, Bangalore (IN); Arun Khamesra, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 16/001,657

(22) Filed: Jun. 6, 2018

(65) Prior Publication Data

US 2019/0319446 A1 Oct. 17, 2019

Related U.S. Application Data

(60) Provisional application No. 62/656,804, filed on Apr. 12, 2018.

(51) Int. Cl.
*H02H 3/08* (2006.01)
*H02H 1/00* (2006.01)
(Continued)

(52) U.S. Cl.
CPC ............ *H02H 3/08* (2013.01); *H01L 27/0266* (2013.01); *H01R 13/6666* (2013.01);
(Continued)

(58) Field of Classification Search
CPC ........ H02H 3/08; H02H 1/0007; H02H 3/087; H01L 27/0266; H01R 13/6666; H01R 24/62; H01R 2107/00
(Continued)

(56) References Cited

U.S. PATENT DOCUMENTS 7,843,248 B1 11/2010 Webb et al.
8,564,257 B2 10/2013 Park et al.
(Continued)

OTHER PUBLICATIONS

"FUSB302B Programmable USB Type-C Controller w/PD" ON Semiconductor, Nov. 2017, pp. 1-32; 32 pages.
(Continued)

*Primary Examiner* — Kevin J Comber

(57) ABSTRACT

An electronic device includes a first switch configured to connect a $V_{CONN}$ supply terminal of a Universal Serial Bus Type-C (USB-C) controller to a first configuration channel (CC) terminal of the USB-C controller in response to a USB-C connector being in a first orientation. A first current may flow through the first switch. The electronic device also includes an overcurrent component coupled to the first switch. The overcurrent component includes a second switch associated with the first switch. The second switch has a second current associated with the first current. The overcurrent component is configured to determine whether the first current is greater than a threshold current based on the first current and the second current. The overcurrent component is also configured to close the first switch in response to determining that the first current is greater than the threshold current.

20 Claims, 8 Drawing Sheets

(51) Int. Cl.
*H01R 24/62* (2011.01)
*H01L 27/02* (2006.01)
*H01R 13/66* (2006.01)
*H01R 107/00* (2006.01)

(52) U.S. Cl.
CPC ........... *H01R 24/62* (2013.01); *H02H 1/0007* (2013.01); *H01R 2107/00* (2013.01)

(58) Field of Classification Search
USPC .......................................................... 361/87
See application file for complete search history.

(56) References Cited

U.S. PATENT DOCUMENTS

| | | | |
|---|---|---|---|
| 8,867,186 B2 | 10/2014 | Croft | |
| 9,268,350 B2 | 2/2016 | Forghani-zadeh et al. | |
| 9,625,988 B1 | 4/2017 | Agarwal et al. | |
| 9,748,761 B2 | 8/2017 | Ohwaki | |
| 9,804,619 B2 | 10/2017 | Motoki | |
| 9,899,825 B2 | 2/2018 | Mattos et al. | |
| 2010/0020450 A1* | 1/2010 | Guillot | H03K 17/166 361/18 |
| 2012/0169377 A1* | 7/2012 | Thiele | G01R 19/0092 327/50 |
| 2013/0314832 A1 | 11/2013 | Guillot et al. | |
| 2016/0190794 A1 | 6/2016 | Forghani-zadeh et al. | |
| 2017/0155214 A1 | 6/2017 | Shen et al. | |
| 2017/0346240 A1* | 11/2017 | Oporta | G06F 13/385 |
| 2018/0123578 A1* | 5/2018 | Chauhan | G01R 19/0092 |
| 2019/0140630 A1* | 5/2019 | Chen | H03K 17/08104 |

OTHER PUBLICATIONS

International Search Report for International Application No. PCT/US19/26110 dated May 14, 2019; 2 pages.
Written Opinion of the International Searching Authority for International Application No. PCT/US19/26110 dated May 14, 2019; 5 pages.

* cited by examiner

US 10,879,686 B2

OVERCURRENT PROTECTION FOR UNIVERSAL SERIAL BUS TYPE-C (USB-C) CONNECTOR SYSTEMS

CROSS-REFERENCE TO RELATED APPLICATIONS

This application claims the benefit of U.S. Provisional Application No. 62/656,804 filed on Apr. 12, 2018, the entire contents of which are hereby incorporated by reference.

TECHNICAL FIELD

Aspects of the present disclosure generally relate to Universal Serial Bus (USB) Type-C connector subsystems, and more particularly, to overcurrent protection for USB Type-C connector subsystems.

BACKGROUND

Various electronic devices (e.g., such as smartphones, tablets, notebook computers, laptop computers, hubs, chargers, adapters, etc.) are configured to transfer power through a USB-C connector system. For example, in some applications an electronic device may be configured as a power consumer to receive power through a USB-C connector system (e.g., for battery charging), while in other applications an electronic device may be configured as a power provider to provide power to another device that is connected thereto through a USB-C connector system. Electronic devices are typically configured to transfer power through Field Effect Transistors (FETs), or other similar switching devices. In some instances, the FETs may become susceptible to electrical damage (e.g., overcurrent damage, overvoltage damage, overheating damage, and so forth) due to, for example, one or more electrical faults possibly occurring on the USB-C connector system.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
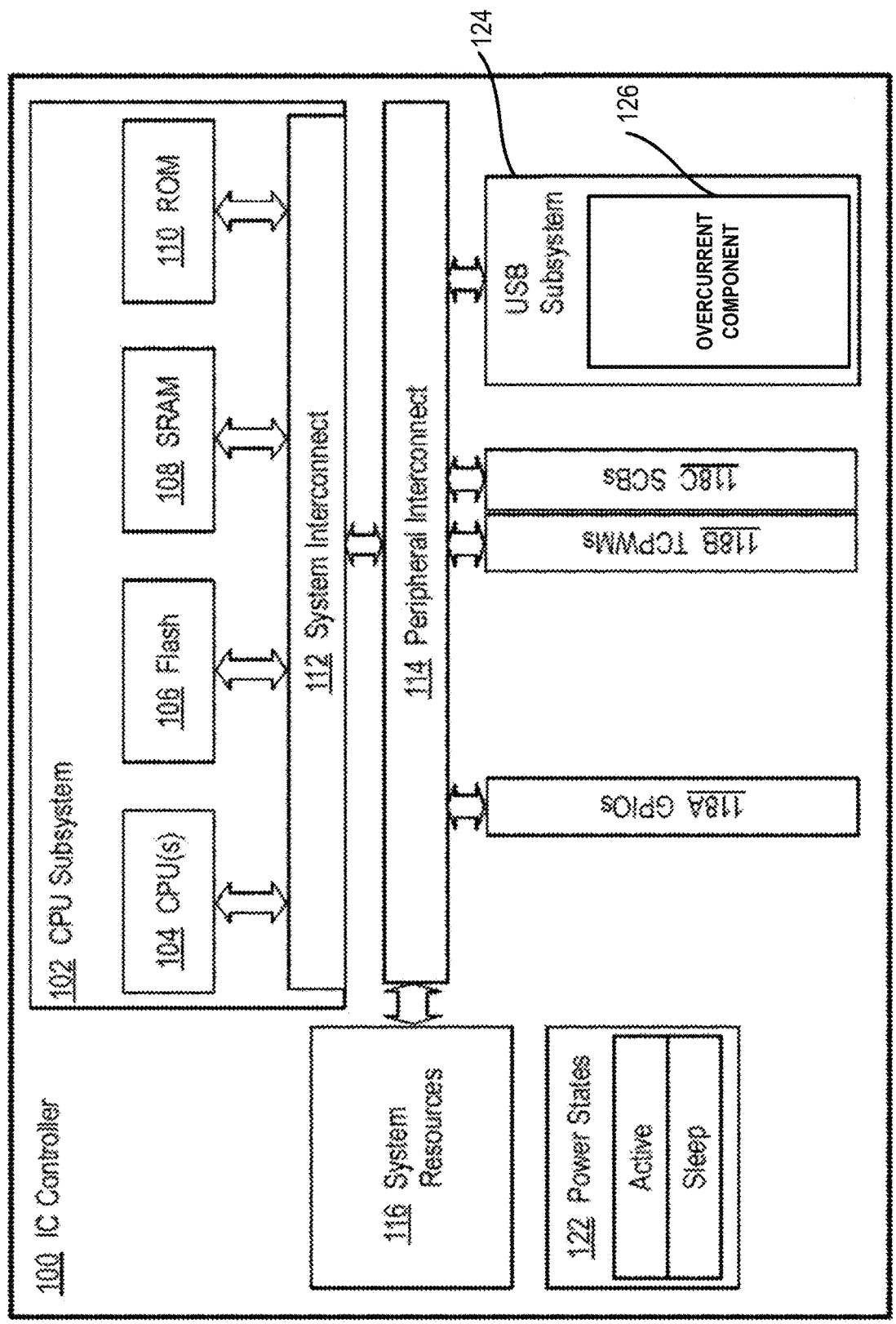
FIG. 1 is a block diagram that illustrates integrated circuit (IC) controller system, in accordance with some embodiments of the present disclosure.

Described herein are various embodiments of techniques for overcurrent and overvoltage protection for USB-C connector systems in electronic devices. Examples of such electronic devices include, without limitation, personal computers (e.g., laptop computers, notebook computers, and so forth), mobile computing devices (e.g., tablets, tablet computers, e-reader devices, and so forth), mobile communication devices (e.g., smartphones, cell phones, personal digital assistants, messaging devices, pocket PCs, and so forth), connectivity and charging devices (e.g., hubs, docking stations, adapters, chargers, etc.), audio/video/data recording and/or playback devices (e.g., cameras, voice recorders, hand-held scanners, monitors, and so forth), and other similar electronic devices that can use USB connectors (interfaces) for communication and/or battery charging.

As used herein, an electronic device or a system is referred to as "USB-enabled" if the electronic device or system complies with at least one release of a Universal Serial Bus (USB) specification. Examples of such USB specifications include, without limitation, the USB Specification Revision 2.0, the USB 3.0 Specification, the USB 3.1 Specification, and/or various supplements (e.g., such as On-The-Go, or OTG), versions and errata thereof. The USB specifications generally define the characteristics (e.g., attributes, protocol definition, types of transactions, bus management, programming interfaces, and so forth) of a differential serial bus that are required to design and build standard communication systems and peripherals.

For example, a USB-enabled peripheral electronic device attaches to a USB-enabled host device through a USB port of the host device to form a USB-enabled system. A USB 2.0 port may include a power line (e.g. VBUS) of 5V, a differential pair of data lines (e.g., which may be denoted D+ or DP, and D− or DN), and a ground line (e.g., GND) for power return. A USB 3.0 port also provides the VBUS, D+, D−, and GND lines for backward compatibility with USB 2.0. In addition, to support a faster differential bus (the USB SuperSpeed bus), a USB 3.0 port also provides a differential pair of transmitter data lines (denoted SSTX+ and SSTX−), a differential pair of receiver data lines (denoted SSRX+ and SSRX−), a power line for power (e.g., which may be denoted DPWR), and a ground line for power return (e.g., which may be denoted DGND). A USB 3.1 port provides the same lines as a USB 3.0 port for backward compatibility with USB 2.0 and USB 3.0 communications, but extends the performance of the SuperSpeed bus by a collection of features referred to as Enhanced SuperSpeed.

An emerging technology for USB connectors, called USB Type-C, was recently defined in various releases of the USB Type-C specification. The various releases of the USB Type-C specification define USB Type-C receptacle, plug, and cables that can support USB communications as well as power delivery over newer USB power delivery protocols defined, for example, in one or more revisions USB Power Delivery (USB-PD) specifications.

Some electronic devices may be compliant with a specific release and/or version of the USB Type-C specification. As used herein, a "USB Type-C subsystem" may refer to, for example, hardware circuitry that may be controllable by firmware and/or software in an integrated circuit (IC) controller, which is configured and operable to perform the functions and to satisfy the requirements specified in at least one release of the USB Type-C specification. Examples of such Type-C functions and requirements may include, without limitation, data and other communications according to USB 2.0 and USB 3.0/3.1, electro-mechanical definitions and performance requirements for Type-C cables, electro-mechanical definitions and performance requirements for Type-C receptacles, electro-mechanical definitions and performance requirements for Type-C connectors or plugs, requirements for Type-C to legacy cable assemblies and adapters, requirements for Type-C-based device detection and interface configuration, requirements for optimized power delivery for Type-C connectors, and so forth. According to the USB Type-C specification(s), a Type-C port provides VBUS, D+, D−, GND, TX+, TX−, SSRX+, and SSRX− lines, among others.

In addition, a Type-C port also provides a Sideband Use (e.g., which may be denoted SBU) line for signaling of sideband functionality and a Configuration Channel (denoted CC) line for discovery, configuration, and management of connections across a Type-C cable. A Type-C port may be associated with a Type-C plug and with a Type-C receptacle. For ease of use, the Type-C plug and the Type-C receptacle are designed as a reversible pair that operates regardless of the plug-to-receptacle orientation. Thus, a standard Type-C connector, disposed as a standard Type-C plug or receptacle, provides pins for four VBUS lines, four ground return (GND) lines, two D+ lines (DP1 and DP2), two D− lines (DN1 and DN2), two TX+ lines (e.g., TXP1 and SSTXP2), two SSTX− lines (SSTXN1 and SSTXN2), two SSRX+ lines (e.g., SSRXP1 and SSRXP2), two SSRX− lines (SSRXN1 and SSRXN2), two CC lines (CC1 and CC2), and two SBU lines (e.g., SBU1 and SBU2), among others.

Some electronic devices may be compliant with a specific revision and/or version of the USB-PD specification. The USB-PD specification defines a standard protocol designed to enable the maximum functionality of USB-enabled devices by providing more flexible power delivery thereto/therefrom along with data communications over a single Type-C cable through USB Type-C ports. For example, the USB-PD specification describes the architecture, protocols, power supply behavior, parameters, and cabling necessary for managing power delivery over USB Type-C cables at up to 100 W of power. According to the USB-PD specification, USB-enabled devices may negotiate for more current and/or higher or lower voltages over a USB Type-C cable than are defined in older USB specifications. As used herein, "USB-PD subsystem" may, in some embodiments, refer to hardware circuitry that may be controllable by firmware and/or software in an integrated circuit (IC) controller, which is configured and operable to perform the functions and to satisfy the requirements specified in at least one release of the USB-PD specification.

An electronic device typically uses a power-transfer circuit (power path) to transfer power to/from the device. Among other electronic components, a power path may include one or more power-FETs that are coupled in-line on the circuit path to operate as switches (e.g., as "ON"/"OFF" switches). Power-FETs differ in some important characteristics from FETs and other types of transistor switch devices that are used for other, non-power-transfer applications. As a discrete semiconductor switching device, a power-FET may carry a large amount of current between its source and its drain while it is "ON", may have low resistance from its source to its drain while it is "ON", and may withstand high voltages from its source to its drain while it is "OFF". For example, a power-FET may be characterized as being able to carry currents in the range of several hundred milliamps (e.g., 500-900 mA) to several amps (e.g., 3-5 A, or higher), and to withstand voltages in the range of 12V to 40V (or higher) across its source to its drain. For example, the resistance between the source and the drain of a power-FET device may be very small in order to prevent, for example, the power loss across the device. The examples, implementations, and embodiments disclosed herein may use different types of switches, transistors, and FETs such as metal-oxide FETs (MOSFETs), nFETs (e.g., N-type MOSFETs), pFETS (e.g., P-type MOSFETS), etc.

FIG. 1 is a block diagram that illustrates integrated circuit (IC) controller 100, in accordance with some embodiments of the present disclosure. The IC controller 100 may be configured in accordance with the techniques for overcurrent and overvoltage protection for USB-C connector systems described herein. In the embodiment illustrated in FIG. 1, IC controller 100 is an integrated circuit (IC) controller chip manufactured on an IC die. For example, IC controller 100 may be a single-chip IC device from the family of CCGx USB controllers developed by Cypress Semiconductor Corporation, San Jose, Calif. In another example, IC controller 100 may be a single-chip IC that is manufactured as a System-on-Chip (SoC).

Among other components, IC controller 100 may include CPU subsystem 102, peripheral interconnect 114, system resources 116, various input/output (I/O) blocks (e.g., 118A-118C), and USB subsystem 124. In addition, IC controller 100 provides circuitry and firmware that is configured and operable to support a number of power states 122. The CPU subsystem 102 may include one or more CPUs (central processing units) 104, flash memory 106, SRAM (Static Random Access Memory) 108, and ROM (Read Only Memory) 110 that are coupled to system interconnect 112. CPU 104 is a suitable processor that can operate in a system-on-chip device. In some embodiments, the CPU may be optimized for low-power operation with extensive clock gating and may include various internal controller circuits that allow the CPU to operate in various power states.

For example, the CPU may include a wake-up interrupt controller that is configured to wake the CPU from a sleep state, thereby allowing power to be switched "OFF" when the IC chip is in the sleep state. Flash memory 106 can be any type of program memory (e.g., NAND flash, NOR flash, and so forth) that is configurable for storing data and/or programs. SRAM 108 can be any type of volatile or non-volatile memory that is suitable for storing data and firmware/software instructions accessed by CPU 104. ROM 110 can be any type of suitable storage that is configurable for storing boot-up routines, configuration parameters, and other system-on-chip firmware parameters and settings. System interconnect 112 is a system bus (e.g., a single-level or multi-level Advanced High-Performance Bus, or AHB) that is configured as an interface that couples the various components of CPU subsystem 102 to each other, as well as a data and control interface between the various components of the CPU subsystem and peripheral interconnect 114.

Peripheral interconnect 114 is a peripheral bus (e.g., a single-level or multi-level AHB) that provides the primary data and control interface between CPU subsystem 102 and its peripherals and other resources, such as system resources 116, I/O blocks (e.g., 118A-118C), and USB subsystem 124. The peripheral interconnect may include various controller circuits (e.g., direct memory access, or DMA controllers), which may be programmed to transfer data between peripheral blocks without burdening the CPU subsystem. In various embodiments, each of the components of the CPU subsystem and the peripheral interconnect may be different with each choice or type of CPU, system bus, and/or peripheral bus.

System resources 116 may include various electronic circuits that support the operation of IC controller 100 in its various states and modes. For example, system resources 116 may include a power subsystem that provides the power resources required for each controller state/mode such as, for example, voltage and/or current references, wake-up interrupt controller (WIC), power-on-reset (POR), etc. In some embodiments, the power subsystem of system resources 116 may also include circuits that allow IC controller 100 to draw and/or provide power from/to external sources with several different voltage and/or current levels. System resources 116 may also include a clock subsystem that provides various clocks that are used by IC controller 100, as well as circuits that implement various controller functions such as external reset.

An IC controller, such as IC controller 100, may include various different types of I/O blocks and subsystems in various embodiments and implementations. For example, in the embodiment illustrated in FIG. 1, IC controller 100 may include GPIO (general purpose input output) blocks 118A, TCPWM (timer/counter/pulse-width-modulation) blocks 118B, SCBs (serial communication blocks) 118C, and USB subsystem 124. GPIO blocks 118A include circuits configured to implement various functions such as, for example, pull-ups, pull-downs, input threshold select, input and output buffer enabling/disabling, multiplex signals connected to various I/O pins, etc. TCPWM blocks 118B include circuits configured to implement timers, counters, pulse-width modulators, decoders and various other analog/mixed signal elements that are configured to operate on input/output signals. SCBs 118C include circuits configured to implement various serial communication interfaces such as, for example, I2C, SPI (serial peripheral interface), UART (universal asynchronous receiver/transmitter), and so forth.

In certain embodiments, the USB subsystem 124 may be utilized in accordance with the techniques described herein, and may also provide support for USB communications over USB ports, as well other USB functionality such as power delivery and battery charging. For example, in various embodiments, USB subsystem 124 may be a USB-PD subsystem, a USB Type-C subsystem, or both (e.g., a USB Type-C subsystem that supports USB-PD functionality). USB subsystem 124 may include a Type-C transceiver and physical layer logic (PHY), which are configured as an integrated baseband PHY circuit to perform various digital encoding/decoding functions (e.g., Biphase Mark Code-BMC encoding/decoding, cyclical redundancy checks-CRC, and so forth) and analog signal processing functions involved in physical layer transmissions. The USB subsystem 124 may be referred to as a USB controller.

In certain embodiments, the IC controller 100 (and/or the USB subsystem 124) may also be configured to respond to communications defined in a USB-PD Specification such as, for example, SOP, SOP', and SOP" messaging. As will be further discussed below, the USB subsystem 124 may also include an overcurrent component 126 (e.g., on-chip circuitry included as part of the USB subsystem 124) to protect one or more components of the IC controller 100 from possible electrical damage (e.g., overcurrent damage, overvoltage damage, overheating damage, and so forth) due to, for example, one or more electrical faults possibly occurring on the IC controller 100. For example, the overcurrent component 126 may protect the IC controller 100 from damage due to too much current flowing through the USB subsystem 124 (e.g., a current source coupled to the USB subsystem 124 providing too much current or overcurrent to the USB subsystem 124).

Overcurrent Protection

Figure 2:
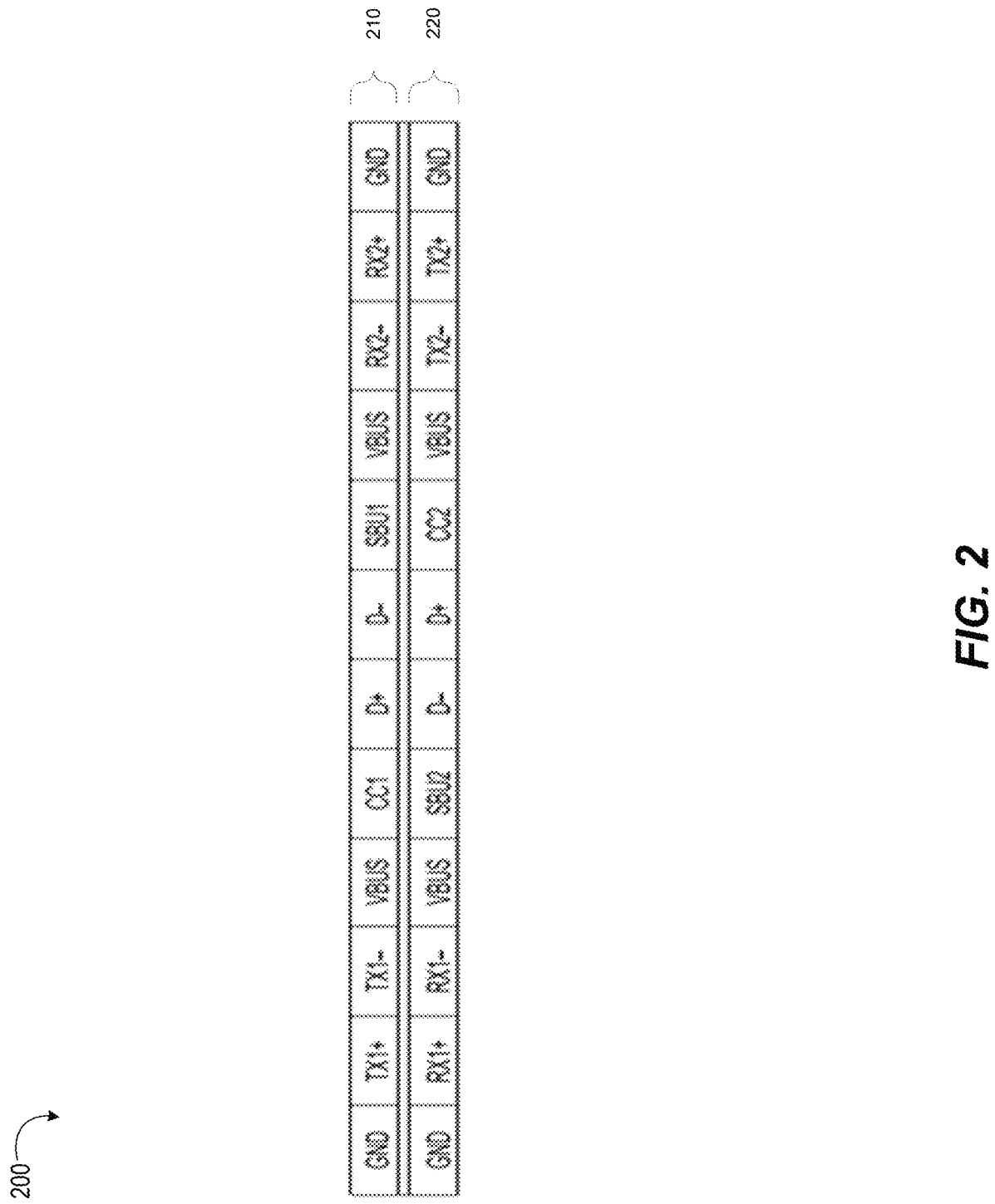
FIG. 2 is a diagram that illustrates an example pin layout for pins that may be included in a USB-C connector or USB-C receptacle, in accordance with some embodiments of the present disclosure.

FIG. 2 is a diagram that illustrates an example pin layout 200 for pins (e.g., terminals, lines, wires, traces, etc.) that may be included in a USB-C connector or USB-C receptacle, in accordance with some embodiments of the present disclosure. The pin layout 200 includes two sets of pins, set 210 and set 220. Starting from left to right, set 210 includes a GND pin, a TX1+ and TX1− pin, a VBUS pin, a CC1 pin, a D+ pin, a D− pin, a SBU1 pin, a VBUS pin, a RX2− pin, a RX2+ pin, and a GND pin. The TX1+ and TX1− in set 210 may also be referred to as SSTX1+ and TTTX1− pins, respectively. Starting from left to right, set 220 includes a GND pin, a RX1+ and RX1− pin, a VBUS pin, a SBU2 pin, a D− pin, a D+ pin, a CC2 pin, a VBUS pin, a TX2− pin, a TX2+ pin, and a GND pin. The TX2+ and TX2− in set 220 may also be referred to as SSTX2+ and TTTX2− pins, respectively.

In USB-PD applications, the two configuration channel pins (e.g., CC1/CC2) of a USB Type-C connector, may be utilized for the detection of cable orientation. Once cable orientation detection is completed, for example, one CC pin is used for VCONN for cable/adapter power and the other CC is used for USB-PD communication. The USB controller or USB subsystem (e.g., USB subsystem 124 illustrated in FIG. 1) may include one or more switches that may be used to couple one CC to a current source or voltage source. The one or more switches may be referred to as VCONN switch. The VCONN switch resistance may be low (e.g., less than 500 mΩ) to support the maximum power delivery of, for example, 1.5 W over 5V. In some embodiments, the VCONN switch may be susceptible to an overcurrent condition during a system level fault. In this fault condition too much current may be provided to VCONN switch. This may cause amps of current (e.g., which may be one or more orders of magnitude greater than normal rating currents) to flow through the VCONN switch. The overcurrent may thus cause electrical and/or thermal damage (e.g., overcurrent damage, overheating damage, and so forth) to the switch as well as to the VCONN power source. In some embodiments, the VCONN SWITCH may include an overcurrent protection during system level fault. Thus, the present techniques may detect an overcurrent condition and may turn off the VCONN switch to avoid or prevent potential electrical and/or thermal damage due to overcurrent.

In certain embodiments, as will be discussed below with respect to FIGS. 3, 4, and 5, for example, the overcurrent component 126 (e.g., on-chip circuitry) of the USB controller or USB subsystem 124 (illustrated in FIG. 1) may provide a VCONN switch overcurrent detection and protection scheme that may be provide to protect, for example, the VCONN switch and VCONN power supply from electrical and/or thermal damage due to an overcurrent (e.g., damage resulting from too much current or overcurrent being provided to the USB controller or USB subsystem 124 by the current or voltage source).

Figure 3A:
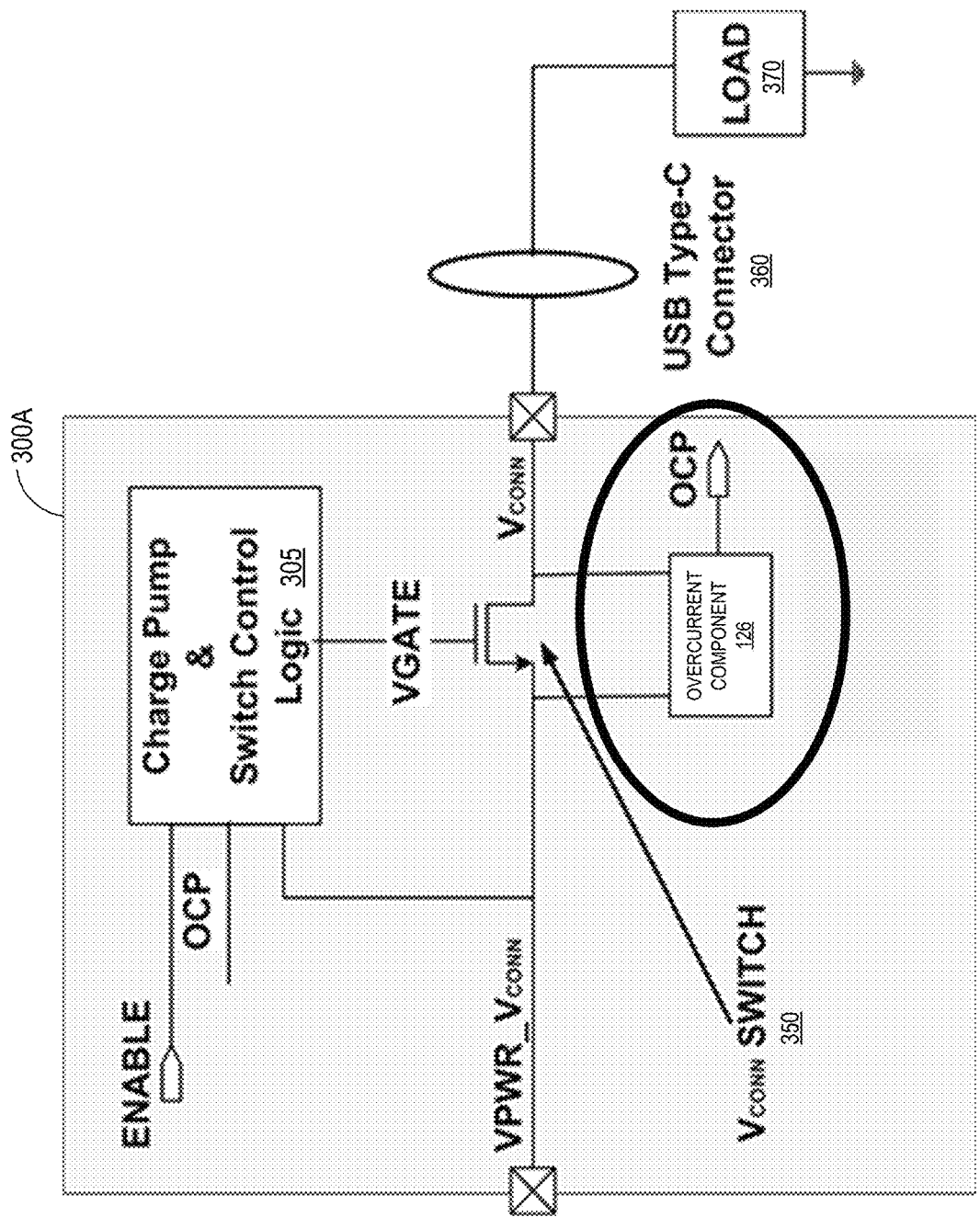
FIG. 3A is a diagram that illustrates an example USB controller, in accordance with some embodiments of the present disclosure.

FIG. 3A is a diagram that illustrates an example USB controller 300A, in accordance with some embodiments of the disclosure. The USB controller 300A may be an example of USB subsystem 124 discussed above in conjunction with FIG. 1. The USB controller 300A includes a charge pump and switch control logic 305, a VCONN switch 350, and an overcurrent component 126. The charge pump and switch control logic 305 may be hardware (e.g., one or more circuits), software, firmware, or a combination thereof, configured to control the operation of one or more charge pumps and to control the operation of the VCONN switch 350. For example, the charge pump and switch control logic 305 may use charge pumps to provide a voltage to the gate VGATE of the VCONN switch 350 to open the VCONN switch 350. Opening the VCONN switch 350 may allow current to flow through the VCONN switch 350. Opening the VCONN switch 350 may also be referred to as activating the VCONN switch 350, turning on the VCONN switch 350, etc. In another example, the charge pump and switch control logic 305 may stop providing a voltage to the gate VGATE of the VCONN switch 350 to close the switch. Closing the VCONN switch 350 may prevent current from flowing through the VCONN switch 350. Closing the VCONN switch 350 may also be referred to as deactivating the VCONN switch 350, turning off the VCONN switch 350, etc. The charge pump and switch control logic 305 may receive an enable input and an OCP input. When the enable input is low (e.g., is set to "0" or some other appropriate value to indicate that the VCONN switch 350 should be closed), the charge pump and switch control logic 305 may close the VCONN switch 350. When the enable input is high (e.g., is set to "1" or some other appropriate value to indicate that the VCONN switch 350 should be opened), the charge pump and switch control logic 305 may open the VCONN switch 350. When the VCONN switch 350 is open, the current and voltage VPWR_VCONN received by the USB controller 300A may be provided to the load 370 via one or more pins of the USB-C connector 360.

In one embodiment, the OCP input may indicate to the charge pump and switch control logic 305 that an overcurrent condition has been detected by the overcurrent component 126. As discussed above, an overcurrent condition may occur when too much current flows through the VCONN switch 350. When the OCP input is high (e.g., is set to "1" or some appropriate value to indicate an overcurrent condition), the charge pump and switch control logic 305 may close the VCONN switch 350.

As illustrated in FIG. 3, the overcurrent component 126 may be configured to detect when an overcurrent condition occurs. For example, the overcurrent component 126 may be configured to detect when the current flowing the VCONN switch 350 is greater than a threshold current, as discussed in more detail below. The overcurrent component 126 may sense the voltage drop across the VCONN switch 350 and may compare that with a reference voltage to determine whether an overcurrent condition has occurred, as discussed in more detail below. If the overcurrent component 126 determines that an overcurrent condition has occurred, the overcurrent component 126 may generate an OCP signal that may be provided to the OCP input of the charge pump and switch control logic 305, as discussed above.

As illustrated in FIG. 3, the overcurrent component 126 is part of the USB controller 300A. For example, instead of using an extra sensing resistor (or another circuit) that is separate from the USB controller 300A, overcurrent component 126 (e.g., the circuits or portions of the overcurrent component 126) are on-chip or are part of the USB controller 300A. Including the overcurrent component 126 as part of the USB controller 300A rather than using an extra sensing resistor allows the total resistance of the VCONN switch to be reduced. Reducing the total resistance of the VCONN switch may allow the USB controller 300A or a device coupled to the USB controller 300A to operate with more power efficiency (e.g., to use less power). Including the overcurrent component 126 as part of the USB controller 300A may also reduce the cost of the device. For example, by removing the extra sensing resistor and using the overcurrent component 126 (e.g., using a second switch and comparators as discussed in more detail below), the cost of the USB controller 300A may be reduced.

Figure 3B:
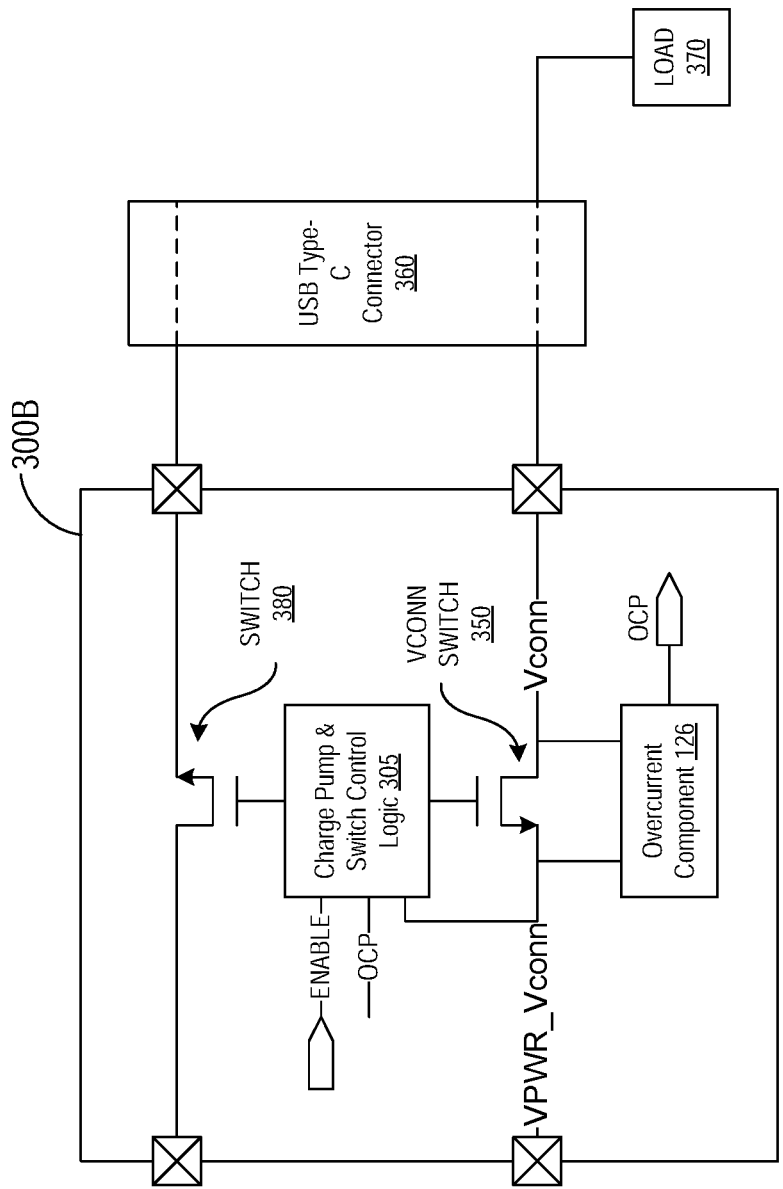
FIG. 3B is a diagram that illustrates an example USB controller, in accordance with some embodiments of the present disclosure.

FIG. 3B is a diagram that illustrates an example USB controller 300B, in accordance with some embodiments of the disclosure. The USB controller 300B may be an example of USB subsystem 124 discussed above in conjunction with FIG. 1. The USB controller 300B includes a charge pump and switch control logic 305, a VCONN switch 350, and an overcurrent component 126. The charge pump and switch control logic 305 may be hardware (e.g., one or more circuits), software, firmware, or a combination thereof, configured to control the operation of one or more charge pumps, and to control the operation of the VCONN switch 350, as discussed above. The charge pump and switch control logic 305 may receive an enable input and an OCP input. When the enable input is low (e.g., is set to "0" or some other appropriate value), the charge pump and switch control logic 305 may close the VCONN switch 350. When the enable input is high (e.g., is set to "1" or some other appropriate value), the charge pump and switch control logic 305 may open the VCONN switch 350. When the VCONN switch 350 is open, the current and voltage VPWR_VCONN received by the USB controller 300B may be provided to the load 370 via one or more pins of the USB-C connector 360.

The USB controller 300B also includes a switch 380. The charge pump and switch control logic 305 may also control the operation of the switch 380, similar to VCONN switch 350. When a USB-C connector is in a first orientation, the current and voltage VPWR_VCONN received by the USB controller 300B may flow through the VCONN switch 350 and the switch 380 may couple a CC terminal of the USB controller 300B to a control channel physical layer logic (PHY) of the USB controller 300B. When the USB-C connector is in a second orientation, the current and voltage VPWR_VCONN received by the USB controller 300B may flow through the switch 380 and the VCONN switch 350 may couple a CC terminal of the USB controller 300B to a control channel physical layer logic (PHY) of the USB controller 300B.

In one embodiment, the OCP input may indicate to the charge pump and switch control logic 305 that an overcurrent condition has been detected by the overcurrent component 126. As discussed above, an overcurrent condition may occur when too much current flows through the VCONN switch 350. When the OCP input is high (e.g., is set to "1" or some appropriate value to indicate an overcurrent condition), the charge pump and switch control logic 305 may close the VCONN switch 350.

As illustrated in FIG. 3, the overcurrent component 126 may be configured to detect when an overcurrent condition occurs. If the overcurrent component 126 determines that an overcurrent condition has occurred, the overcurrent component 126 may generate an OCP signal that may be provided to the OCP input of the charge pump and switch control logic 305, as discussed above. In one embodiment, the overcurrent component 126 may also be coupled to the switch 380. This may allow the overcurrent component 126 to determine when an overcurrent condition has occurred when a USB-C connector is in the second orientation. In another embodiment, the USB controller 300B may include a second overcurrent component (e.g., a duplicate of overcurrent component 126) and the second overcurrent component may be coupled to the switch 380.

As illustrated in FIG. 3, the overcurrent component 126 is part of the USB controller 300B. Including the overcurrent component 126 as part of the USB controller 300B rather than using an extra sensing resistor allows the total resistance of the VCONN switch to be reduced. Reducing the total resistance of the VCONN switch may allow the USB controller 300B or a device coupled to the USB controller 300B to operate with more power efficiency (e.g., to use less power). Including the overcurrent component 126 as part of the USB controller 300B may also reduce the cost of the device.

Figure 4:
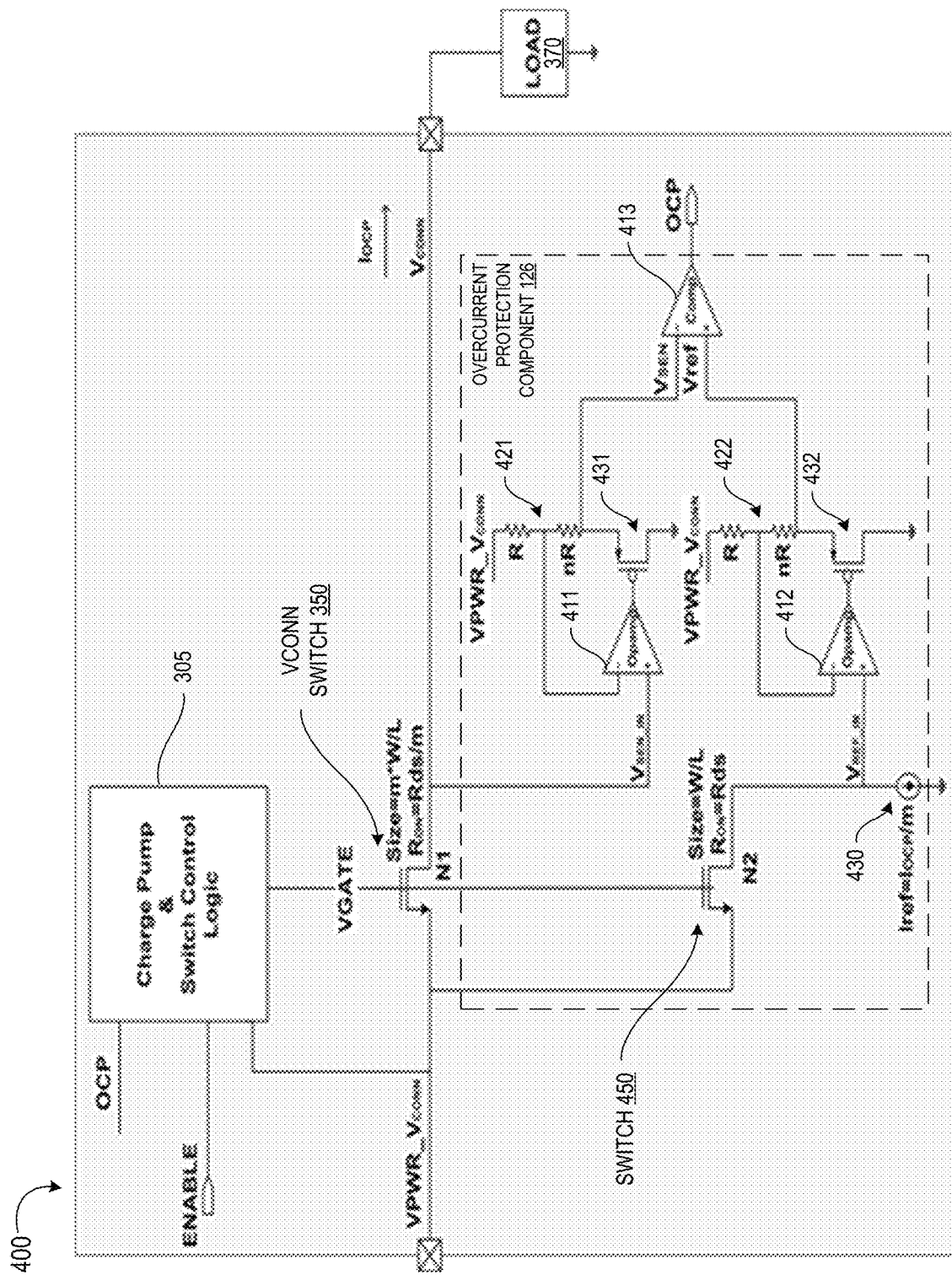
FIG. 4 is a diagram that illustrates an example USB controller, in accordance with some embodiments of the present disclosure.

FIG. 4 is a diagram that illustrates an example USB controller 400, in accordance with some embodiments of the present disclosure. The USB controller 400 may be an example of USB subsystem 124 discussed above in conjunction with FIG. 1. The USB controller 400 includes a charge pump and switch control logic 305, a VCONN switch 350, and an overcurrent component 126. The charge pump and switch control logic 305 may be hardware (e.g., one or more circuits), software, firmware, or a combination thereof, configured to control the operation of one or more charge pumps and to control the operation of the VCONN switch 350, as discussed above. The charge pump and switch control logic 305 may receive an enable input and an OCP input. When the enable input is low, the charge pump and switch control logic 305 may close the VCONN switch 350. When the enable input is high, the charge pump and switch control logic 305 may open the VCONN switch 350.

In one embodiment, the OCP input may indicate to the charge pump and switch control logic 305 that an overcurrent condition has been detected by the overcurrent component 126. As discussed above, an overcurrent condition may occur when too much current flows through the VCONN switch 350. When the OCP input is high (e.g., is set to "1" or some appropriate value to indicate an overcurrent condition), the charge pump and switch control logic 305 may close the VCONN switch 350.

In one embodiment, the overcurrent component 126 may be configured to detect when an overcurrent condition occurs. For example, the overcurrent component 126 may be configured to detect when the current flowing the VCONN switch 350 is greater than a threshold current, as discussed in more detail below. The overcurrent component 126 senses the voltage drop across the VCONN switch 350 and may compare that with a reference voltage to determine whether an overcurrent condition has occurred, as discussed in more detail below. If the overcurrent component 126 determines that an overcurrent condition has occurred, the overcurrent component 126 may generate an OCP signal that may be provided to the OCP input of the charge pump and switch control logic 305, as discussed above.

As illustrated in FIG. 4, the overcurrent component 126 includes a switch 450. The switch 450 is associated with the VCONN switch 350. For example, the VCONN switch 350 and the switch 450 may be coupled to each other in parallel. In another example, the switch 450 and the VCONN switch 350 may receive the same current. A first current associated with the voltage VPWR_VCONN may flow through the VCONN switch 350. A second current associated with the first current may flow through the switch 450. For example the same current that is provided to the VCONN switch 350 may also be provided to the switch 450.

In one embodiment, the switch 450 may be a FET with a size of W/L. The size W/L may be referred to as W/L ratio. The VCONN switch 350 may have a size of m*(W/L). Thus, the size of the switch 450 may be proportional to the size of the VCONN switch 350. For example, the size of the switch 450 may be a fraction of the size of the size of the VCONN switch 350 (e.g., 1/m). The switch 450 may be referred to as a replica switch or a replica FET.

The first current flowing through the VCONN switch 350 may provide a voltage drop across VCONN switch 350. This voltage drop is amplified using amplifier component 411 along with resistive divider 421 and amplifier-output stage 431. The second current flowing through switch 450 may provide a voltage drop across switch 450 based on the programmable current IRef defined by current source 430. This voltage drop is amplified using amplifier component 412 along with resistive divider 422 and amplifier-output-stage 432.

In one embodiment, the resistive divider 421 and resistive divider 422, the amplifier component 411 and 412, the amplifier-output stage 431 and 432, may be identical to give same amplification to both voltage drops across VCONN switch 350 and switch 450. Examples of amplifier component include an operational amplifier (opamp). The reference current IRef may be determined using the following equation (1):

$$IRef = IOCP/m \quad (1)$$

where IOCP is the threshold current at which the overcurrent component 126 will close the VCONN switch 350 (e.g., the overcurrent threshold) and where the size of the switch 450 is 1/m of the VCONN switch 350.

The comparison component 413 may be coupled to both the amplifier component 411 and the amplifier component 412. The comparison component 413 may receive a voltage VSEN on one input (via the amplifier component 411) and may receive a voltage VREF on another input (via the amplifier component 412. VSEN may be determined using the following equations (2) or (3):

$$VSEN = VPWR\_VCONN - n*(Rds/m)*IOCP \quad (2)$$

$$VSEN = VPWR\_VCONN - n*Rds*IOCP/m \quad (3)$$

where Rds is the resistance of the switch 450 when the switch 450 is open, where VPOWER_VCONN is the voltage of the current that is provided to the VCONN switch 350 and the switch 450, and where n is the gain of the first stage. VREF may be determined using the following equations (4) or (5)

$$VREF = VPWR\_VCONN - n*Rds*Iref \quad (4)$$

$$VREF = VPWR\_VCONN - n*Rds*IOCP/m \quad (5)$$

In one embodiment, the overcurrent component 126 may determine that an overcurrent condition has occurred (e.g., that the current flowing through the VCONN switch 350 is greater than the threshold current IOCP) when VSEN is less than VREF. When VSEN is less than VREF, the comparison component 413 may output a high value (e.g., a "1" or some other appropriate value) and the charge pump and switch control logic 305 may close the one or more of the VCONN switch 350 and the switch 450 to prevent damage to the USB controller 400 or other devices coupled to the USB controller 400. If VSEN is greater than VREF, the comparison component 413 may output a low value (e.g., a "0" or some other appropriate value) and the charge pump and switch control logic 305 may allow the VCONN switch 350 to remain open.

As discussed above, the VCONN switch 350 may be configured to couple a CC terminal of the USB controller 400 (not illustrated in FIG. 4) to a VCONN supply terminal of the USB controller (not illustrated in FIG. 4) when a USB-C connector is in a first orientation. In one embodiment, the VCONN switch 350 may be configured to couple a CC terminal of the USB controller 400 (not illustrated in FIG. 4) to a control channel physical layer logic (PHY) of the USB controller 400 (not illustrated in FIG. 4) when the USB connector is in a second orientation (e.g., when the USB-C connector is flipped over).

In one embodiment, the USB controller 400 may include a third switch (e.g., switch 380 illustrated in FIG. 3B). The third switch may be configured to couple a CC terminal of the USB controller 400 (not illustrated in FIG. 4) to a VCONN supply terminal of the USB controller (not illustrated in FIG. 4) when a USB-C connector is in a first orientation. The third switch may also be configured to couple a CC terminal of the USB controller 400 (not illustrated in FIG. 4) to a control channel physical layer logic (PHY) of the USB controller 400 (not illustrated in FIG. 4) when the USB-C connector is in a second orientation. The third switch and the VCONN switch 350 may allow a USB-C connector to be reversible (e.g., to be plugged into a USB-C receptacle in different orientations).

In one embodiment, the overcurrent component 126 may be coupled to the third switch. This may allow the overcurrent component 126 to detect overcurrent conditions when the third switch is coupled to a VCONN supply terminal of the USB controller 400. The overcurrent component 126 may close the third switch if the current flowing through the third switch is greater than the current threshold IOCP, as discussed above.

In another embodiment, the third switch may be coupled to a second or duplicate overcurrent component (e.g., the USB controller 400 may include two separate overcurrent components). For example, the second or duplicate overcurrent component may include switches, comparison components, resistive dividers, etc., as discussed above. A second or duplicate overcurrent component may detect overcurrent conditions when the third switch is coupled to a VCONN supply terminal of the USB controller 400. The second or duplicate overcurrent component may close the third switch if the current flowing through the third switch is greater than the current threshold IOCP, as discussed above.

In other embodiments other devices, circuits, components may be used in the overcurrent component 126. For example, the programmable current source 430 could be replaced with a programmable resistor (e.g., a tapped resistor ladder) and the voltage on the programmable resistor may be compared with the voltage on the VCONN terminal. In another example, an analog to digital converter (ADC) may be used in place of the amplifier components 411 and 412, and comparison 413. If an ADC is used in place of the comparison components 411 and 412, and comparison 413, the current source may be fixed (may not be programmable) and the current threshold IOCP may be adjusted by comparing the measured ADC value with a stored numerical threshold value.

In different embodiments, the programmable current source 430 may be programmed in various different ways. For example, a non-volatile memory or an array of storage elements may be used to store configuration data, such as configurations or settings for the programmable current source 430. In various implementations and embodiments, the configuration data may be stored in any suitable volatile and/or non-volatile storage that may include, but is not limited to, an array of storage elements, a re-programmable flash memory, re-programmable or one-time programmable (OTP) registers, a RAM array, and an array of data flops. In some embodiments the firmware instructions and its data may be stored on-chip, while in other embodiments some (or all) of the firmware instructions and its data may be stored in an external memory (e.g., serial EEPROM) and may be executed-in-place or may be read and loaded into the volatile memory of IC controller 200 prior to execution or at certain operational events (e.g., at power on or reset).

It should be understood that various embodiments may provide various mechanisms to facilitate the re-configurabilty and/or re-programmability of a USB controller (and of its various components) that operates in accordance with the techniques described herein. For example, some embodiments may store configuration and/or program data in logic circuits that are enabled/disabled by using resistor-based fuses that are trimmed when the USB controller is manufactured. Examples of such fuses include laser fuses, e-fuses, and non-volatile latches that have some characteristics of fuses and some characteristics of non-volatile memory. In some embodiments, pin-strapping may be used to facilitate the programmability of the USB controller. A pin-strapping mechanism may involve connecting (e.g., via jumpers or PCB traces) a number of controller pins/terminals to power or ground to have each input provide a binary value to the USB controller, where the collection of the provided input values is used configuration data to configure or program one or more components of the controller. In some embodiments, the configuration data for programming the USB controller may be stored as a resistor configuration storage. For example, a set of resistors may be connected between a set of pins/terminals of the USB controller and power or ground, to create a voltage or current that can be measured by an ADC to produce a binary value to configure one or more parameters of the controller. In other embodiments, the configuration data for programming the USB controller may be provided as a mask ROM or a metal mask. For example, a chip manufacturer can customize a particular batch of USB controller chips by changing the connections of pre-defined internal nodes between a "1" and a "0" using a single lithographic mask that is specific to that custom configuration with other masks remaining unchanged between batches, thereby providing custom configuration parameters for the particular batch of controllers.

It should be understood that various embodiments may provide various types of programmability for an USB controller (and of its components) that operates in accordance with the techniques described herein. For example, some embodiments may provide dynamic programmability, in which configuration changes are re-programmed in the course of normal operation of the USB controller, usually (but not necessarily always) in response to a change in one or more operating conditions or an external command and based on data previously programmed into the controller. Other embodiments may use in-system programmability, in which configuration changes are re-programmed in the course of normal operation of the USB controller in response to an external command and based on new configuration data downloaded into the controller in association of the command. In some embodiments, the USB controller may be factory-programmed as part of its manufacture or as part of the manufacture of an end product (e.g., such as a power adapter, a wall socket, a car charger, a power bank, etc.). For example, the IC controller may be programmed during manufacture by using various mechanisms such as firmware instructions stored in non-volatile memory, pin-strapping, resistor programming, laser-trimmed fuses, NV latches, or OTP registers.

Figure 5:
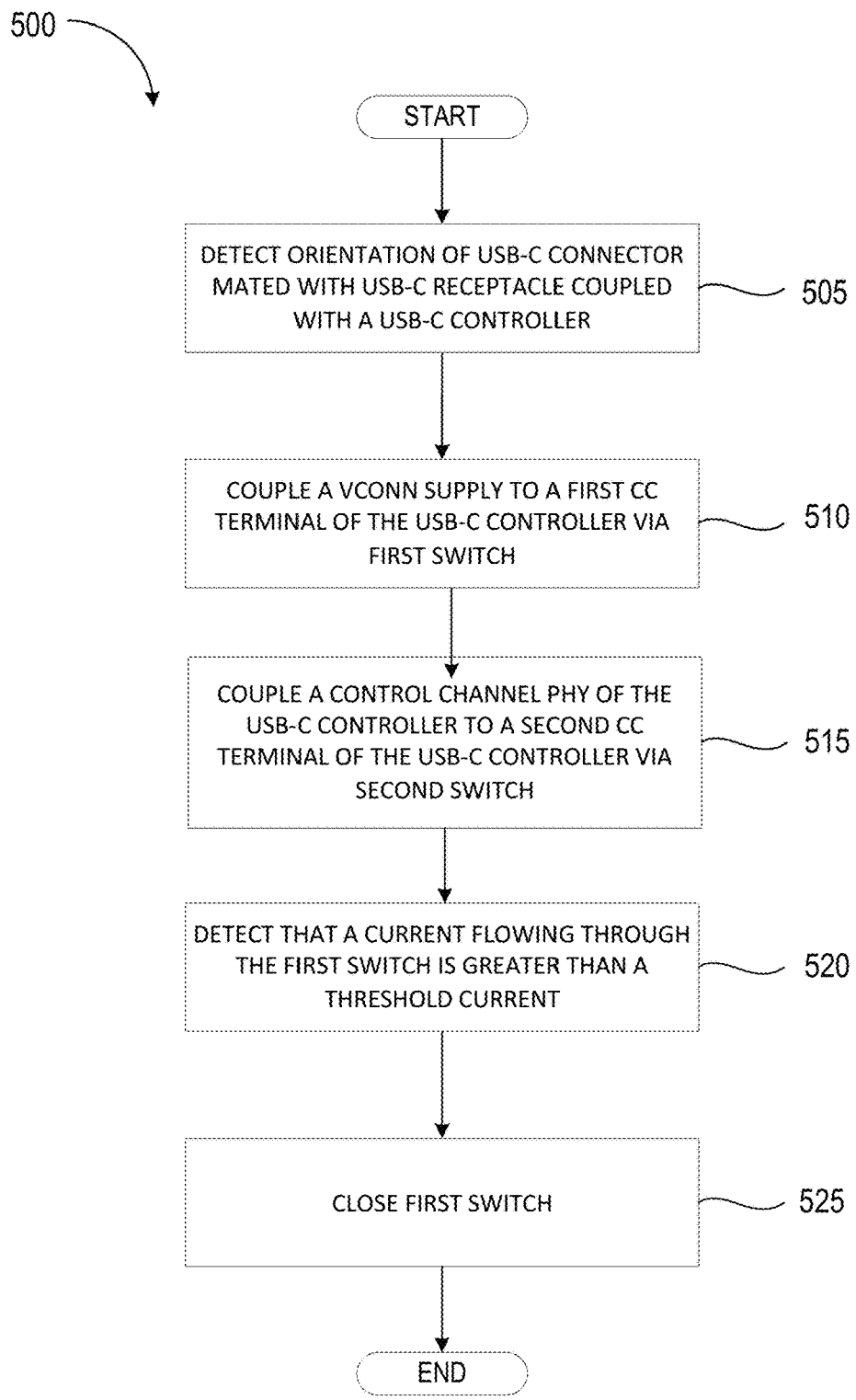
FIG. 5 is a flow diagram of a method of providing overcurrent protection for USB-C connector systems, in accordance with some embodiments of the present disclosure.

FIG. 5 is a flow diagram of a method of providing overcurrent protection for USB-C connector systems, in accordance with some embodiments of the present disclosure. Method 500 may be performed by processing logic that may comprise hardware (e.g., circuitry, dedicated logic, programmable logic, a processor, a processing device, a central processing unit (CPU), a multi-core processor, a system-on-chip (SoC), etc.), software (e.g., instructions running/executing on a processing device), firmware (e.g., microcode), or a combination thereof. In some embodiments, the method 500 may be performed by a USB subsystem (e.g., USB subsystem 124 illustrated in FIG. 1), a USB controller (e.g., USB controller 300A, USB controller 300B, and USB controller 400 illustrated in FIGS. 3A, 3B, and 4), or an overcurrent component (e.g., overcurrent component 126 illustrated in FIGS. 1, 3, and 4).

The method 500 may begin at block 505 with detecting an orientation of a USB-C connector mated with a USB-C receptacle coupled with a USB-C controller. At block 510, the method 500 may couple a VCONN supply to a first CC terminal of the USB-C controller via a first switch, based on the orientation of the USB-C connector. At block 515, the method 500 may couple a control channel PHY of the USB-C controller to a second CC terminal of the USB-C controller via a second switch, based on the orientation of the USB-C connector. At block 520, the method 500 may detect that a current flowing through the first switch is greater than a threshold current using the first switch and a third switch that is associated with the first switch. In response to determining that the current flowing through the first switch is greater than the threshold current, the method 500 may close the first switch at block 525.

Figure 6A:
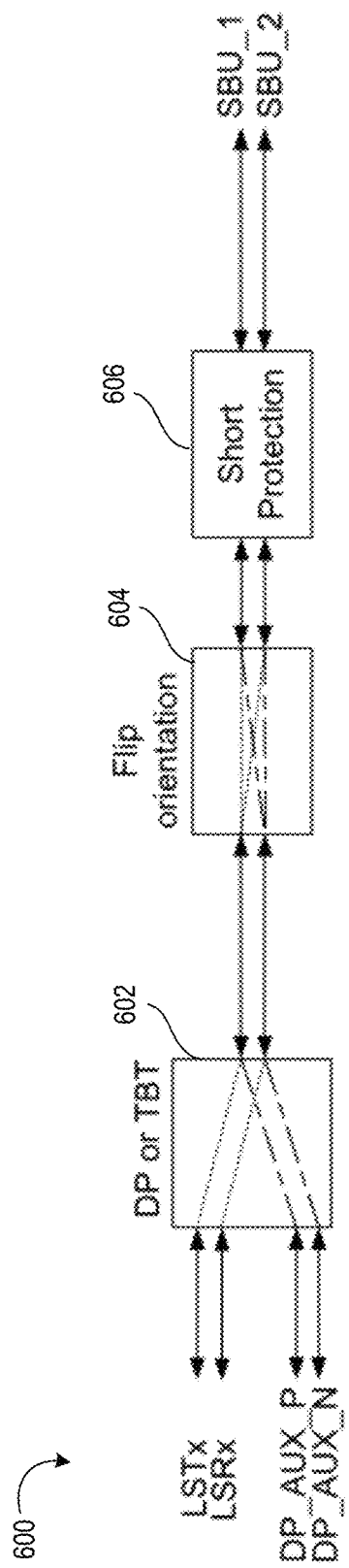
FIG. 6A is a block diagram of a SBU crossbar switch for USB-C connector systems, in accordance with some embodiments of the present disclosure.
Figure 6B:
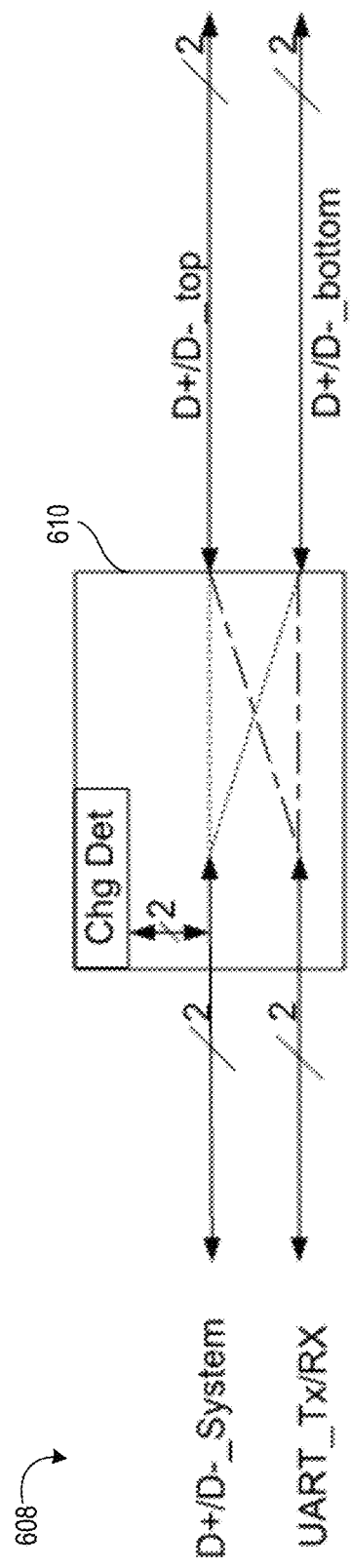
FIG. 6B is a block diagram of a DP/DM switch for USB-C connector systems, in accordance with some embodiments of the present disclosure.

FIG. 6A is a block diagram of a SBU crossbar switch 600 for USB-C connector systems, in accordance with some embodiments of the present disclosure. FIG. 6B is a block diagram of a DP/DM switch 608 for USB-C connector systems, in accordance with some embodiments of the present disclosure. In certain embodiments, as illustrated by FIGS. 6A and 6B, it may be useful to describe the present techniques with respect to a block diagram of a SBU crossbar switch 600 as illustrated by FIG. 6A and a block diagram of a DP/DM switch 608 as illustrated in FIG. 6B. For example, the SBU crossbar switch 600 may include a SBU switch MUX (e.g., 2×1 MUX) and a single 2×2 cross bar SBU switch per the Type-C port. In some embodiments, as further illustrated by FIG. 6A, the SBU crossbar switch 600 may include Display Port (DP) or Thunderbolt (TBT) block 602 that may allow selections between the Display Port or Thunderbolt modes and the routing signals to the appropriate SBU1 and/or SUB2 based on CC (e.g., Type-C plug) orientation (e.g., via either orientation) as determined by a flip orientation block 604. In some embodiments, in accordance with the present techniques, the fault protection block 606 of the SBU crossbar switch 600 and the Chg/Det block 610 of the DP/DM switch 608 may be provided the overcurrent protection schemes or functionality as discussed herein (e.g., implemented for each orientation and each direction of signal path).

USB Type-C Example Applications

The techniques for overcurrent and overvoltage protection described herein may be embodied in several different types of USB Type-C applications. Examples of such types of Type-C applications include, but may not be limited to: a downstream facing port (DFP) USB application, in which an IC controller with a USB Type-C subsystem is configured to provide a downstream-facing USB port (e.g., in a USB-enabled host device); an upstream facing port (UFP) USB application, in which an IC controller with a USB Type-C subsystem may be utilized to provide an upstream-facing USB port (e.g., in a USB-enabled peripheral device or adapter); and a dual role port (DRP) USB application, in which an IC controller with a USB Type-C subsystem is configured to support both DFP and UFP applications on the same USB port.

Figure 7:
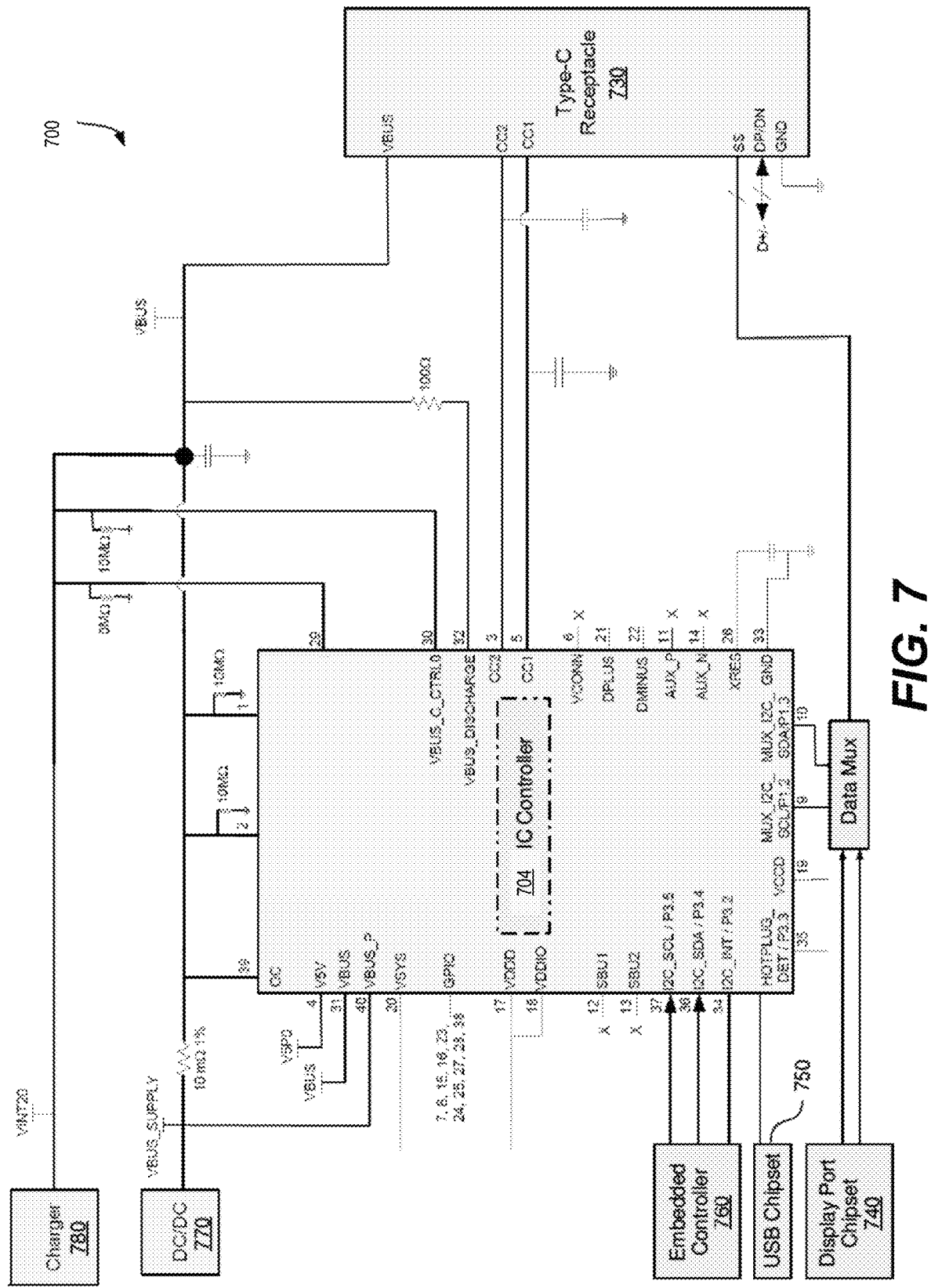
FIG. 7 is a block diagram of an example apparatus that may perform one or more of the operations described herein, in accordance with some embodiments of the present disclosure.

FIG. 7 illustrates an example system 700 in which IC controller 704 with a USB Type-C subsystem and a USB-PD subsystem is configured to provide a DRP application. In an example embodiment, IC controller 704 may be a single-chip IC device from the family of CCGx USB controllers developed by Cypress Semiconductor Corporation, San Jose, Calif. In system 700, IC controller 704 is coupled to Type-C receptacle 730, to display port chipset 740, to USB chipset 750, to embedded controller 760, to power supply 770, and to charger 780. These components of system 700 may be disposed on a printed circuit board (PCB) or other suitable substrate, and are coupled to each other by suitable means such conductive lines, traces, buses, etc.

In certain embodiments, the Type-C receptacle 730 may be configured in accordance with a USB Type-C specification to provide connectivity through a Type-C port. Display port chipset 740 is configured to provide a DisplayPort functionality through the Type-C receptacle 730. USB chipset 750 is configured to provide support for USB communications (e.g., such as USB 2.0 communications) through the D+/− lines of Type-C receptacle 730. Embedded controller 760 is coupled to IC controller 704 and is configured to provide various control and/or data transfer functions in system 700. The Power supply 770 may include a DC/DC power source that is coupled to the IC controller 704.

In certain embodiments, as previously discussed above, the IC controller 704 may include overcurrent detection and protection circuitry to carry out the overcurrent techniques as described above. For example, as illustrated in FIG. 7, because the overcurrent detection and protection circuitry is constructed as part of the IC controller 704 (e.g., on-chip), in some embodiments, singular PHY control channels may couple the respective CC1 and CC2 terminals of the IC controller 704 via a "direct connection" 790 (e.g., which may herein refer to an electric connection via or including a passive component such as a resistor or capacitor, but without any electrical connection via an active component such as a diode or transistor) to the respective CC1 and CC2 terminals of the Type-C receptacle 730.

Specifically, by enabling the respective CC1 and CC2 terminals IC controller 704 to be directly connected (e.g., without the utilization of any active electronic component, which further constitutes a reduction of hardware) to the IC controller 704 to the respective CC1 and CC2 terminals of the Type-C receptacle 730 and including the overcurrent detection and protection circuitry are constructed as part of the IC controller 704 (e.g., on-chip), the present techniques may reduce, for example, response time, BOM, and power consumption of the system 700. This may also prevent or reduce damaged caused to the IC controller 704 and to other device or components that may be couple to the IC controller.

Unless specifically stated otherwise, terms such as "detecting," "decoupling," "coupling," "opening," "closing," "connecting," "disconnecting," "determining," "comparing," or the like, refer to actions and processes performed or implemented by computing devices that manipulates and transforms data represented as physical (electronic) quantities within the computing device's registers and memories into other data similarly represented as physical quantities within the computing device memories or registers or other such information storage, transmission or display devices. Also, the terms "first," "second," "third," "fourth," etc., as used herein are meant as labels to distinguish among different elements and may not necessarily have an ordinal meaning according to their numerical designation.

The methods and illustrative examples described herein are not inherently related to any particular computer or other apparatus. Various general purpose systems may be used in accordance with the teachings described herein, or it may prove convenient to construct more specialized apparatus to perform the required method steps. The required structure for a variety of these systems will appear as set forth in the description above.

The above description is intended to be illustrative, and not restrictive. Although the present disclosure has been described with references to specific illustrative examples, it will be recognized that the present disclosure is not limited to the examples described. The scope of the disclosure should be determined with reference to the following claims, along with the full scope of equivalents to which the claims are entitled.

As used herein, the singular forms "a", "an" and "the" are intended to include the plural forms as well, unless the context clearly indicates otherwise. It will be further understood that the terms "comprises", "comprising", "may include", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" or "configurable to" perform a task or tasks. In such contexts, the phrase "configured to" or "configurable to" is used to connote structure by indicating that the units/circuits/components include structure (e.g., circuitry) that performs the task or tasks during operation. As such, the unit/circuit/component can be said to be configured to perform the task, or configurable to perform the task, even when the specified unit/circuit/component is not currently operational (e.g., is not on). The units/circuits/components used with the "configured to" or "configurable to" language include hardware—for example, circuits, memory storing program instructions executable to implement the operation, etc. Reciting that a unit/circuit/component is "configured to" perform one or more tasks, or is "configurable to" perform one or more tasks, is expressly intended not to invoke 35 U.S.C. 112, sixth paragraph, for that unit/circuit/component.

Additionally, "configured to" or "configurable to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks. "Configurable to" is expressly intended not to apply to blank media, an unprogrammed processor or unprogrammed generic computer, or an unprogrammed programmable logic device, programmable gate array, or other unprogrammed device, unless accompanied by programmed media that confers the ability to the unprogrammed device to be configured to perform the disclosed function(s).

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:
1. An electronic device, comprising:
a first transistor configured to connect a $V_{CONN}$ supply terminal of a Universal Serial Bus Type-C (USB-C) controller directly to a first configuration channel (CC) terminal of the USB-C controller in response to a USB-C connector being in a first orientation, wherein the first transistor allows a first current to flow through the first transistor; and
an overcurrent component coupled to the first transistor, wherein:
the overcurrent component comprises a second transistor associated with the first transistor, wherein a first input of the first transistor and a second input of the second transistor are coupled to the $V_{CONN}$ supply terminal and the second transistor is disconnected from the first CC terminal;
the second transistor allows a second current to flow through the second transistor;
the second current corresponds to the first current; and
the overcurrent component is configured to:
determine whether the first current to is greater than a threshold current, based on the first current and the second current; and
close the first transistor in response to determining that the first current is greater than the threshold current.

2. The electronic device of claim 1, further comprising:
a third transistor configured to connect a second CC terminal of the USB-C controller to a control channel physical layer logic (PHY) of the USB-C controller in response to the USB-C connector being in the first orientation.

3. The electronic device of claim 2, wherein the third transistor is further configured to connect the $V_{CONN}$ supply terminal of the Universal Serial Bus Type-C (USB-C) controller to the first configuration channel (CC) terminal of the USB-C controller in response to the USB-C connector being in a second orientation.

4. The electronic device of claim 3, wherein the overcurrent component is configured to:
determine whether a third current to flow through the third transistor is greater than the threshold current based on the second current and the third current; and
close the third transistor in response to determining that the second current is greater than the threshold current, wherein the second current is associated with the third current in response to the USB-C connector being in the second orientation.

5. The electronic device of claim 3, further comprising:
a second overcurrent component coupled to the third transistor, wherein:
a third current flows through the third transistor;
the second overcurrent component comprises a fourth transistor associated with the third transistor, wherein the fourth transistor has a fourth current associated with the third current; and
the second overcurrent component is configured to:
determine whether the third current is greater than the threshold current based on the third current and the fourth current; and
close the third transistor in response to determining that the second current is greater than the threshold current.

6. The electronic device of claim 1, wherein the first transistor comprises a first field-effect transistor (FET) and the second transistor comprises a second FET.

7. The electronic device of claim 6, wherein the first FET has a first size, wherein the second FET has a second size, and wherein the second size is proportionally smaller than the first size.

8. The electronic device of claim 1, wherein the overcurrent component further comprises:
a first amplifier coupled to the first transistor; and
a second amplifier coupled to the second transistor.

9. The electronic device of claim 8, wherein the overcurrent component further comprises:
a comparator coupled to the first amplifier and the second amplifier, wherein the third comparator is configured to determine whether the first current is greater than the threshold current based on the first current and the second current.

10. The electronic device of claim 1, further comprising a current source coupled to the second transistor, wherein the current source is configured to adjust the threshold current.

11. A system, comprising:
a Universal Serial Bus Type-C (USB-C) receptacle configured to receive a USB-C connector;
a first transistor coupled to the USB-C receptacle and configured to connect a $V_{CONN}$ supply terminal of a Universal Serial Bus Type-C (USB-C) controller directly to a first configuration channel (CC) terminal of the USB-C controller in response to the USB-C connector being in a first orientation, wherein the first transistor allows a first current to flow through the first transistor; and
an overcurrent component coupled to the first transistor, wherein:
the overcurrent component comprises a second transistor associated with the first transistor, wherein a first input of the first transistor and a second input of the second transistor are coupled to the $V_{CONN}$ supply terminal and the second transistor is disconnected from the first CC terminal;
the second transistor allows a second current to flow through the second transistor;
the second current corresponds to the first current; and
the overcurrent component is configured to:
determine whether the first current is greater than a threshold current, based on the first current and the second current; and
close the first transistor in response to determining that the first current is greater than the threshold current.

12. The system of claim 11, further comprising:
a third transistor configured to connect a second CC terminal of the USB-C controller to a control channel physical layer logic (PHY) of the USB-C controller in response to the USB-C connector being in the first orientation.

13. The system of claim 12, wherein the third transistor is further configured to connect the $V_{CONN}$ supply terminal of the Universal Serial Bus Type-C (USB-C) controller to the first configuration channel (CC) terminal of the USB-C controller in response to the USB-C connector being in a second orientation.

14. The system of claim 13, wherein the overcurrent component is configured to:
determine whether a third current to flow through the third transistor is greater than the threshold current based on the second current and the third current; and
close the third transistor in response to determining that the second current is greater than the threshold current, wherein the second current is associated with the third current in response to the USB-C connector being in the second orientation.

15. The system of claim 13, further comprising:
a second overcurrent component coupled to the third transistor, wherein:
a third current flows through the third transistor;
the second overcurrent component comprises a fourth transistor associated with the third transistor, wherein the fourth transistor has a fourth current associated with the third current; and
the second overcurrent component is configured to:
determine whether the third current is greater than the threshold current based on the third current and the fourth current; and
close the third transistor in response to determining that the second current is greater than the threshold current.

16. The system of claim 11, wherein the overcurrent component further comprises:
a first amplifier coupled to the first transistor; and
a second amplifier coupled to the second transistor.

17. The system of claim 16, wherein the overcurrent component further comprises:
a comparator coupled to the first amplifier and the second amplifier, wherein the third comparator is configured to determine whether the first current is greater than the threshold current based on the first current and the second current.

18. The system of claim 11, further comprising a current source coupled to the second transistor, wherein the current source is configured to adjust the threshold current.

19. A method, comprising:
- detecting, by a Universal Serial Bus Type-C (USB-C) controller, an orientation of a USB-C connector mated with a USB-C receptacle coupled with the USB-C controller;
- coupling a VCONN supply terminal to a second CC terminal of a plurality of CC terminals of the USB-C controller based on the orientation of the USB-C connector via a first transistor, wherein the first transistor is connected directly to the VCONN supply terminal and the second CC terminal;
- detecting that a first current flowing through the first transistor is greater than a threshold current using the first current and a second current flowing through a second transistor, wherein the second current corresponds to the first current and wherein a first input of the first transistor and a second input of the second transistor are coupled to the $V_{CONN}$ supply terminal and the second transistor is disconnected from the first configuration channel (CC) terminal; and
- in response to detecting that the first current flowing through the first transistor is greater than the threshold current, closing the first transistor.

20. The method of claim 19, further comprising:
coupling a control channel physical layer logic (PHY) of the USB-C controller to a first configuration channel (CC) terminal of the plurality of CC terminals of the USB-C controller.

* * * * *